United States Patent
Ortet et al.

(10) Patent No.: US 11,736,018 B2
(45) Date of Patent: Aug. 22, 2023

(54) VOLTAGE COMPARATOR AND METHOD

(71) Applicant: STMicroelectronics (Rousset) SAS, Rousset (FR)

(72) Inventors: Sebastien Ortet, Chateauneuf-le-Rouge (FR); Didier Davino, Pourrières (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 99 days.

(21) Appl. No.: 17/370,609

(22) Filed: Jul. 8, 2021

(65) Prior Publication Data

US 2022/0038003 A1 Feb. 3, 2022

(30) Foreign Application Priority Data

Jul. 30, 2020 (FR) ..................................... 2008088

(51) Int. Cl.
*H02M 3/158* (2006.01)
*H02M 1/00* (2006.01)

(52) U.S. Cl.
CPC ....... *H02M 3/1588* (2013.01); *H02M 1/0009* (2021.05); *H02M 1/0025* (2021.05)

(58) Field of Classification Search
CPC ............ H02M 1/0009; H02M 1/0025; H02M 1/0032; H02M 1/0054; H02M 1/0058; H02M 3/158; H02M 3/1588
See application file for complete search history.

(56) References Cited

U.S. PATENT DOCUMENTS

| | | | |
|---|---|---|---|
| 6,480,135 B2 | 11/2002 | Gendai | |
| 2009/0167261 A1 | 7/2009 | Trochut | |
| 2011/0018516 A1* | 1/2011 | Notman | H02M 3/1588 323/284 |
| 2011/0075452 A1* | 3/2011 | Santoro | H02M 3/33571 363/56.1 |
| 2011/0148377 A1 | 6/2011 | Schiff et al. | |
| 2012/0105045 A1* | 5/2012 | Burns | H02M 3/158 323/311 |
| 2015/0318785 A1* | 11/2015 | Svorc | H02M 3/1588 323/235 |
| 2019/0020275 A1* | 1/2019 | Childs | H02M 1/08 |
| 2019/0214914 A1* | 7/2019 | Ali | H02M 3/33523 |
| 2020/0259415 A1* | 8/2020 | Chiu | H02M 3/1584 |
| 2020/0366207 A1* | 11/2020 | Luo | H02M 3/156 |
| 2021/0135574 A1* | 5/2021 | Esch | H02M 3/1588 |
| 2022/0321009 A1* | 10/2022 | Ortet | H02M 3/158 |

OTHER PUBLICATIONS

Mitra, Srinjoy et al., "A low-power dual-threshold comparator for neuromorphic systems", IEEE Research in Microelectronics and Electronics, 2005 PhD, Jul. 28, 2005, 4 pages.

* cited by examiner

*Primary Examiner* — Fred E Finch, III
(74) *Attorney, Agent, or Firm* — Slater Matsil, LLP

(57) ABSTRACT

An embodiment electronic device includes a first circuit including first and second transistors series-coupled between a node of application of a power supply voltage and a node of application of a reference voltage, the first and second transistors being coupled to each other by a first node, and a second circuit, configured to compare a first voltage on the first node with first and second voltage thresholds.

20 Claims, 7 Drawing Sheets

VOLTAGE COMPARATOR AND METHOD

CROSS-REFERENCE TO RELATED APPLICATIONS

This application claims the benefit of French Application No. 2008088, filed on Jul. 30, 2020, which application is hereby incorporated herein by reference.

TECHNICAL FIELD

The present disclosure generally concerns electronic devices and, more particularly, devices comprising a circuit configured to determine whether a voltage is within a determined range, for example, DC/DC voltage converters comprising such a circuit, of switched-mode power supply type, which convert a DC power supply voltage into a DC output voltage, for example buck type DC/DC voltage converters where the DC output voltage has a value lower than that of the DC power supply voltage.

BACKGROUND

In a switched-mode power converter, a direct current (DC) voltage for powering the converter is chopped by the switching of switches to implement phases of power storage in an assembly comprising an inductive element and a capacitive element and phases of delivery, to a load connected to the converter output, of the power stored in this assembly.

In a pulse frequency modulation (PFM) type switched-mode converter, each operating cycle of the converter comprises a phase of power storage in the assembly, followed by a phase of power delivery to the load connected to the converter. During the power storage phase, the current flowing through the inductive element increases. During the power delivery phase, the current flowing through the inductive element decreases. For each operating cycle, it is desirable for the current flowing through the inductive element to be null at the beginning of the power storage phase and at the end of the power delivery phase.

Known switched-mode converters, particularly of PFM type, have various disadvantages.

SUMMARY

An embodiment overcomes all or part of the disadvantages of known devices comprising a circuit configured to determine the sign of a current.

An embodiment electronic device comprises a first circuit comprising first and second transistors series-coupled between a node of application of a power supply voltage and a node of application of a reference voltage, the first and second transistors being coupled to each other by a first node; and a second circuit, configured to compare a first voltage on the first node with first and second voltage thresholds.

An embodiment method of controlling an electronic device comprises a first circuit comprising first and second transistors series-coupled between a node of application of a power supply voltage and a node of application of a reference voltage, the first and second transistors being coupled to each other by a first node; and a second circuit comparing a first voltage on the first node with first and second voltage thresholds.

According to an embodiment, the second circuit comprises third and fourth transistors series-coupled between second and third nodes, the third and fourth transistors being coupled to each other by a fourth node, coupled to the first node.

According to an embodiment, the second node is coupled to the node of application of the power supply voltage by a first resistive element, and the third node is coupled to the node of application of the reference voltage by a second resistive element.

According to an embodiment, the control terminal of the third transistor is coupled to a node of application of the second voltage threshold and the control terminal of the fourth transistor is coupled to a node of application of the first voltage threshold.

According to an embodiment, the first voltage threshold is the power supply voltage and the second voltage threshold is the reference voltage.

According to an embodiment, the second circuit comprises a first output node having a signal, taking a first value when the first voltage is greater than the first voltage threshold and a second value when the first voltage is smaller than the first voltage threshold, supplied thereon; and a second output node having a signal, taking a first value when the first voltage is smaller than the second voltage threshold and a second value when the first voltage is greater than the second voltage threshold, supplied thereon.

According to an embodiment, the first output node is coupled to the second node and the second output node is coupled to the third node.

According to an embodiment, the first output node is coupled to the second node by two inverter circuits and the second output node is coupled to the third node by an inverting circuit.

According to an embodiment, the first transistor is connected in parallel with a first diode, the second transistor is connected in parallel with a second diode, the anode of the first diode and the cathode of the second diode being connected to the first node.

According to an embodiment, the device is a switched-mode power supply.

According to an embodiment, the device comprises a third circuit configured to compare the first voltage with a second voltage, the second voltage being variable and depending on the signals on the first and second output nodes.

According to an embodiment, the device comprises a fourth circuit configured to control the first and second transistors in such a way that each operating cycle successively comprises a first phase during which the first transistor is on and the second transistor is off; a second phase during which the first and second transistors are off; a third phase during which the first transistor is off and the second transistor is on; and a fourth phase during which the first and second transistors are off.

According to an embodiment, the variation of the second voltage is dependent on the signals on the first and second output nodes during the fourth phase.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
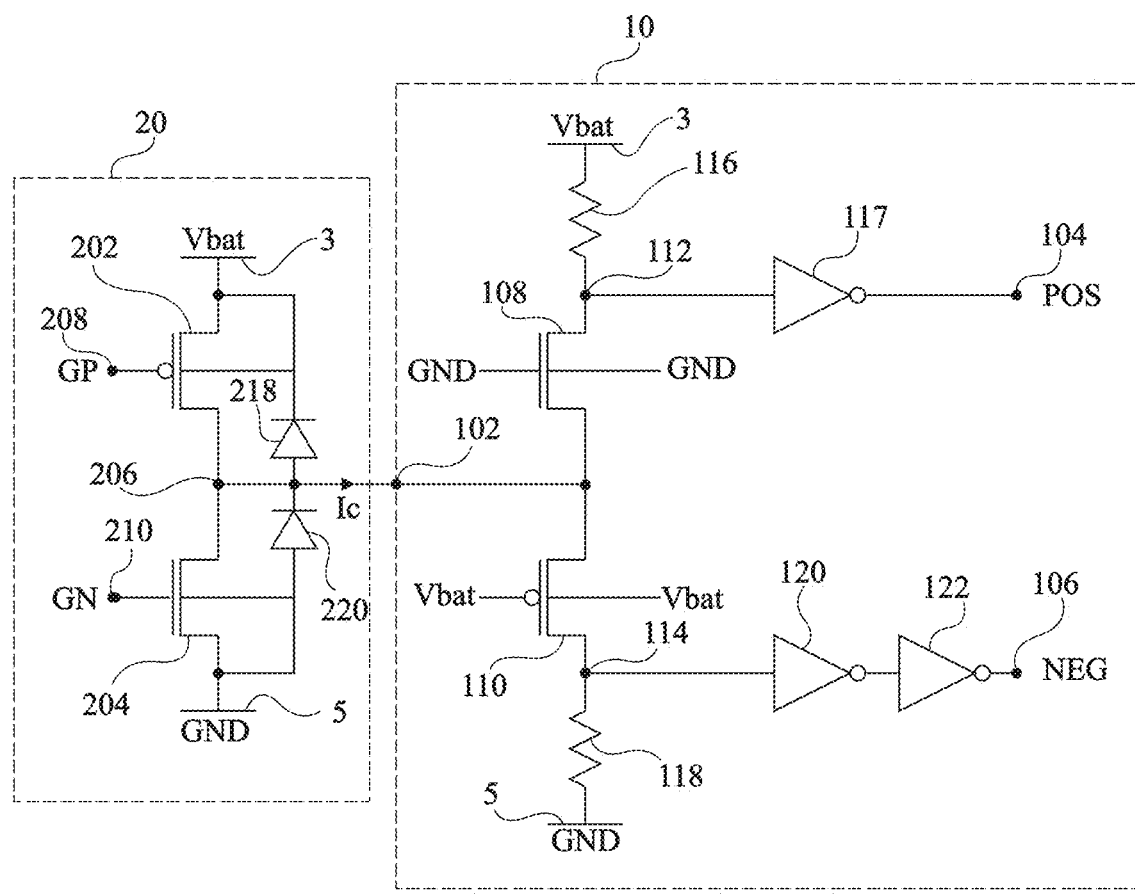
FIG. 1 shows an embodiment of an electronic device comprising a circuit configured to determine whether a voltage is within a voltage range.

FIG. 1 shows an electronic device comprising an embodiment of a circuit 10 configured to determine whether an input voltage is within a voltage range. In other words, circuit 10 is configured to compare the input voltage with first and second voltage thresholds, different from each other.

The device comprises a circuit 20, for example a power stage. Circuit 20 is an example of a circuit configured to generate the input voltage of circuit 10. Circuit 20 comprises two transistors 202 and 204. Transistors 202 and 204 are coupled, preferably connected, in series between a rail 3 of application of a power supply voltage Vbat and a rail 5 of application of a reference voltage, for example, ground GND. In other words, one of the conduction terminals, source or drain, of transistor 202 is coupled, preferably connected, to rail 3 and the other conduction terminal, drain or source, is coupled, preferably connected, to a central node 206. One of the conduction terminals of transistor 204, source or drain, is coupled, preferably connected, to node 206 and its other conduction terminal, drain or source, is coupled, preferably connected, to rail 5.

Preferably, transistor 202 is a P-type field-effect or PMOS transistor and transistor 204 is an N-type field-effect or NMOS transistor.

Circuit 20 comprises two inputs 208 and 210. Input 208 receives a signal GP for controlling transistor 202. Input 208 is thus coupled, preferably connected, to the control terminal or gate of transistor 202. Input 210 receives a control signal GN of transistor 204. Input 210 is thus coupled, preferably connected, to the control terminal or gate of transistor 204.

Node 206 is coupled, preferably connected, to an input node 102 of circuit 10. A current Ic is supplied, via nodes 206 and 102, to the input of circuit 10. Similarly, a voltage VLX, on node 206, is supplied to the input node 102 of circuit 10. In operation, node 206 is for example coupled to a load, the load being for example powered by circuit 20.

Circuit 20 further comprises two diodes 218 and 220. Diodes 218 and 220 are series-coupled between rail 3 and rail 5. More particularly, a first terminal, anode or cathode, of diode 220 is coupled, preferably connected, to rail 5 and a second terminal, cathode or anode, of diode 220 is coupled, preferably connected, to node 206. A first terminal, anode or cathode, of diode 218 is coupled, preferably connected, to node 206 and a second terminal, cathode or anode, of diode 218 is coupled, preferably connected, to rail 3. In the example of FIG. 1, the first terminals of diodes 218 and 220 are the anodes and the second terminals of diodes 218 and 220 are the cathodes. Node 206 is thus coupled to the anode of one of the diodes and to the cathode of the other diode.

In other words, each diode is coupled, preferably connected, in parallel with one of transistors 202 and 204. For example, the anode of diode 218 is coupled, preferably connected, to the source of transistor 202 and the cathode of diode 218 is coupled, preferably connected, to the drain of transistor 202. Similarly, the anode of diode 220 is coupled, preferably connected, to the source of transistor 204 and the cathode of diode 220 is coupled, preferably connected, to the drain of transistor 204. For example, the cathode of diode 218 is also coupled, preferably connected, to the substrate of transistor 202. The anode of diode 220 is also, for example, coupled, preferably connected, to the substrate of transistor 204. Preferably, diodes 218 and 220 respectively are the intrinsic diodes of transistors 202 and 204.

Circuit 10 comprises input 102 and two outputs 104 and 106. Input 102 receives voltage VLX, which is desired to be compared with the voltage range and, more particularly, which is desired to be compared with the first and second voltage thresholds. In the example of FIG. 1, the first and second thresholds are respectively the positive power supply voltage Vbat of the device and a reference voltage GND, preferably the ground. Output 104 supplies a signal POS, preferably binary, and output 106 supplies a signal NEG, preferably binary. When circuit 10 determines that the input voltage is greater than the first threshold Vbat of the range, signal NEG takes a first value, for example, a high value. If the input voltage is smaller than first threshold Vbat, voltage NEG takes a second value, for example a low value. When circuit 10 determines that the input voltage is smaller than the second threshold of the range, signal POS takes a first value, for example, a high value. If the input voltage is greater than the second threshold, voltage POS takes a second value, for example, a low value.

Thus, if signals POS and NEG both have a low value, this means that the input voltage is between the first and second thresholds. If signal NEG has a high value and signal POS has a low value, the input voltage has a value greater than the first threshold. If signal NEG has a low value and signal POS has a high value, the input voltage has a value smaller than the second threshold.

Circuit 10 comprises two transistors 108 and 110 series-coupled between rails 3 and 5. More particularly, one of the conduction terminals, source or drain, of transistor 108 is coupled, preferably connected, a node 112. The other conduction terminal of transistor 108, drain or source, is coupled, preferably connected, to input node 102. One of the conduction terminals of transistor 110, source or drain, is coupled, preferably connected, to node 102. The other conduction terminal of transistor 110, drain or source, is coupled, preferably connected, to a node 114.

Preferably, transistor 110 is a P-type field-effect or PMOS transistor and transistor 108 is an N-type field-effect or NMOS transistor. Preferably, transistors 108 and 110 are coupled, preferably connected, to node 102, by their respective sources.

Transistor 108 is controlled by a voltage having a value substantially equal, preferably equal, to the second voltage threshold, here reference voltage GND. In other words, the control terminal or gate of transistor 108 is coupled to rail 5 of application of voltage GND. Transistor 110 is controlled by a voltage having a value substantially equal, preferably equal, to the first voltage threshold, here power supply voltage Vbat. In other words, the control terminal, or gate, of transistor 110 is coupled to rail 3 of application of voltage Vbat.

Node 112 is coupled to rail 3, preferably by a resistive element, or resistor, 116. Node 112 is also coupled to output node 104, preferably by a circuit or inverter 117 configured to invert the binary signals. Thus, when circuit 117 receives a low input value, it delivers a high output voltage, and conversely.

Node 114 is coupled to rail 5, preferably by a resistive element or resistor 118. Node 114 is also coupled to output node 106, preferably by two circuits or inverters 120 and 122 in series, configured to invert the binary signals.

Resistive element 116, transistor 108, transistor 110, and resistive element 118 are thus series-coupled in this order between rail 3 and rail 5.

Circuits 117, 120, and 122 enable to ensure that signals POS and NEG are binary signals having recognizable high and low values.

Figure 2:
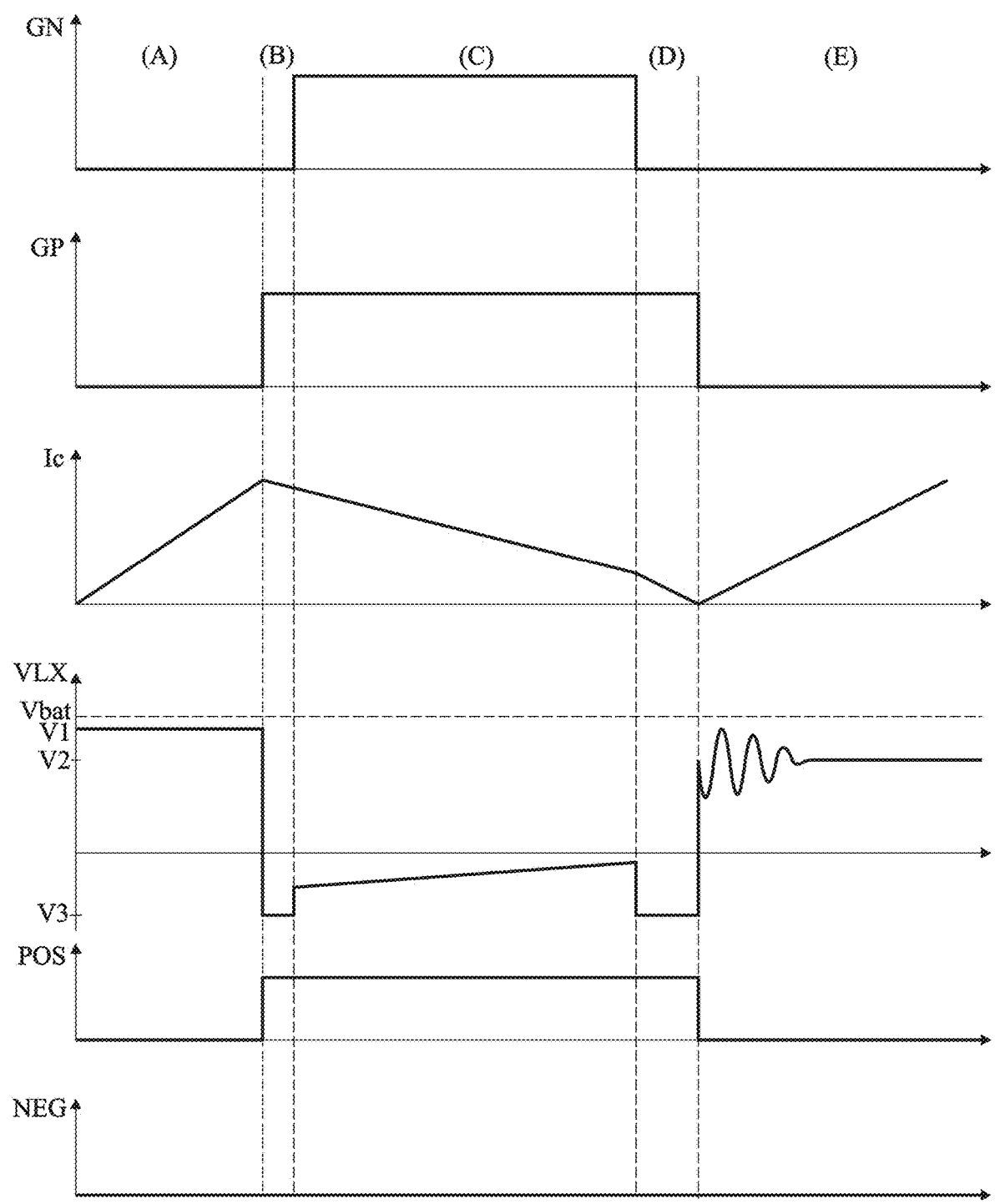
FIG. 2 shows timing diagrams illustrating the operation of the embodiment of FIG. 1.

FIG. 2 shows timing diagrams illustrating the operation of the embodiment of FIG. 1. More particularly, FIG. 2 shows the behavior of control signals GN, GP, of current Ic, of voltage VX on node 206, and signals POS and NEG, during an operating cycle of the circuit 20 of FIG. 1, and during part (E) of a next cycle. The operating cycle for example comprises four phases: a phase (A) of power storage in an inductive element, not shown in FIG. 1, having a terminal coupled to node 102, an intermediate phase (B), a power delivery phase (C), and a compensation phase (D).

During power storage phase (A), transistor 202 is on and transistor 204 is off. This corresponds, in the embodiment of FIG. 1, to the control signal GN having a low value and to the control signal GP having a low value. Voltage VLX thus has a positive value V1, smaller than value Vbat. Thus, during phase (A), the current Ic crossing the inductive element, not shown in FIG. 1, increases.

Voltage VLX being smaller than the control voltage of transistor 110, that is, power supply voltage Vbat, the gate-source voltage of transistor 110 is positive. Transistor 110 thus remains off during phase (A). Thus, the voltage on node 114 has a low value, for example, substantially equal to reference voltage GND. Signal NEG, at the output of inverters 120 and 122 thus has a low value.

Similarly, voltage VLX is greater than the control voltage of transistor 108, that is, reference voltage GND, the gate-source voltage of transistor 108 is negative. Transistor 108 thus remains off during phase (A). Thus, the voltage on node 112 has a high value, for example, substantially equal to voltage Vbat. Signal POS, at the output of inverter 117, thus has a low value.

During phase (B), transistors 204 and 202 are off. This corresponds, in the embodiment of FIG. 1, to control signal GN having a low value and to control signal GP having a high value. The phase (B) is an intermediate phase enabling to ensure that transistors 208 and 210 are not simultaneously on. During phase (B), node 206 is no longer powered by rail 3. Current Ic thus decreases. Current Ic is positive and transistors 202 and 204 are off. Current Ic thus crosses diode 220. Voltage VLX takes a negative value V3.

Voltage VLX being smaller than the control voltage of transistor 110, that is, power supply voltage Vbat, the gate-source voltage of transistor 110 is positive. Transistor 110 thus remains off during phase (B). Thus, the voltage on node 114 is a low value, for example, substantially equal to reference voltage GND. Signal NEG, at the output of inverters 120 and 122, thus has a low value.

Voltage VLX is negative. In other words, voltage VLX is smaller than the control voltage of transistor 108, that is, reference voltage GND. The gate-source voltage of transistor 108 is thus positive. Transistor 108 is thus on during phase (B). Thus, the voltage on node 112 has a low value, for example, substantially equal to voltage V3. Signal POS, at the output of inverter 117, thus has a high value.

Signals POS and NEG thus indicate that voltage VLX is smaller than the two thresholds Vbat and GND. More particularly, the low value of signal NEG indicates that voltage VLX is smaller than threshold Vbat is either in the range from values GND and Vbat, or outside of the range and smaller than threshold GND. The high value of signal POS indicates that voltage VLX is smaller than threshold value GND, and is thus outside of the range between values GND and Vbat.

During phase (C), that is, the power delivery phase, transistor 204 is on and transistor 202 is off. This corresponds, in the embodiment of FIG. 1, to control signal GN having a high value and to control signal GP having a high value. Voltage VLX increases but remains negative. During phase (C), current Ic decreases, node 206 being no longer powered by rail 3.

Voltage VLX being smaller than the control voltage of transistor 110, that is, power supply voltage Vbat, the gate-source voltage of transistor 110 is positive. Transistor 110 thus remains off during phase (C). Thus, the voltage on node 114 has a low value, for example, substantially equal to reference voltage GND. Signal NEG, at the output of inverters 120 and 122 thus has a low value.

Voltage VLX is negative. In other words, voltage VLX is smaller than the control voltage of transistor 108, that is, reference voltage GND. The gate-source voltage of transistor 108 is thus positive. Transistor 108 is thus on during phase (B). Thus, the voltage on node 112 has a low value, for example, substantially equal to voltage V3. Signal POS, at the output of inverter 117, thus has a high value.

During phase (D), transistor 204 is off and transistor 202 is off. This corresponds, in the embodiment of FIG. 1, to control signal GN having a low value and to control signal GP having a high value.

As in phase (B), current Ic is positive and transistors 202 and 204 are off. Current Ic thus crosses diode 220. Voltage VLX takes a negative value V3.

Voltage VLX being, as in phase (B), smaller than the control voltage of transistor 110, that is, power supply voltage Vbat, the gate-source voltage of transistor 110 is positive. Transistor 110 thus remains off during phase (B). Thus, the voltage on node 114 has a low value, for example, substantially equal to reference voltage GND. Signal NEG, at the output of inverters 120 and 122 thus has a low value.

As in phase (B), voltage VLX is negative. In other words, voltage VLX is smaller than the control voltage of transistor 108, that is, reference voltage GND. The gate-source voltage of transistor 108 is thus positive. Transistor 108 is thus on during phase (B). Thus, the voltage on node 112 has a low value, for example, substantially equal to voltage V3. Signal POS, at the output of inverter 117, thus has a high value.

During phase (D), current Ic keeps on decreasing. Phase (D) ends when current Ic reaches value zero.

Phase (D) is for example followed by a phase (E) for example corresponding to phase (A) of a next operating cycle or to a phase in the off state.

Figure 3:
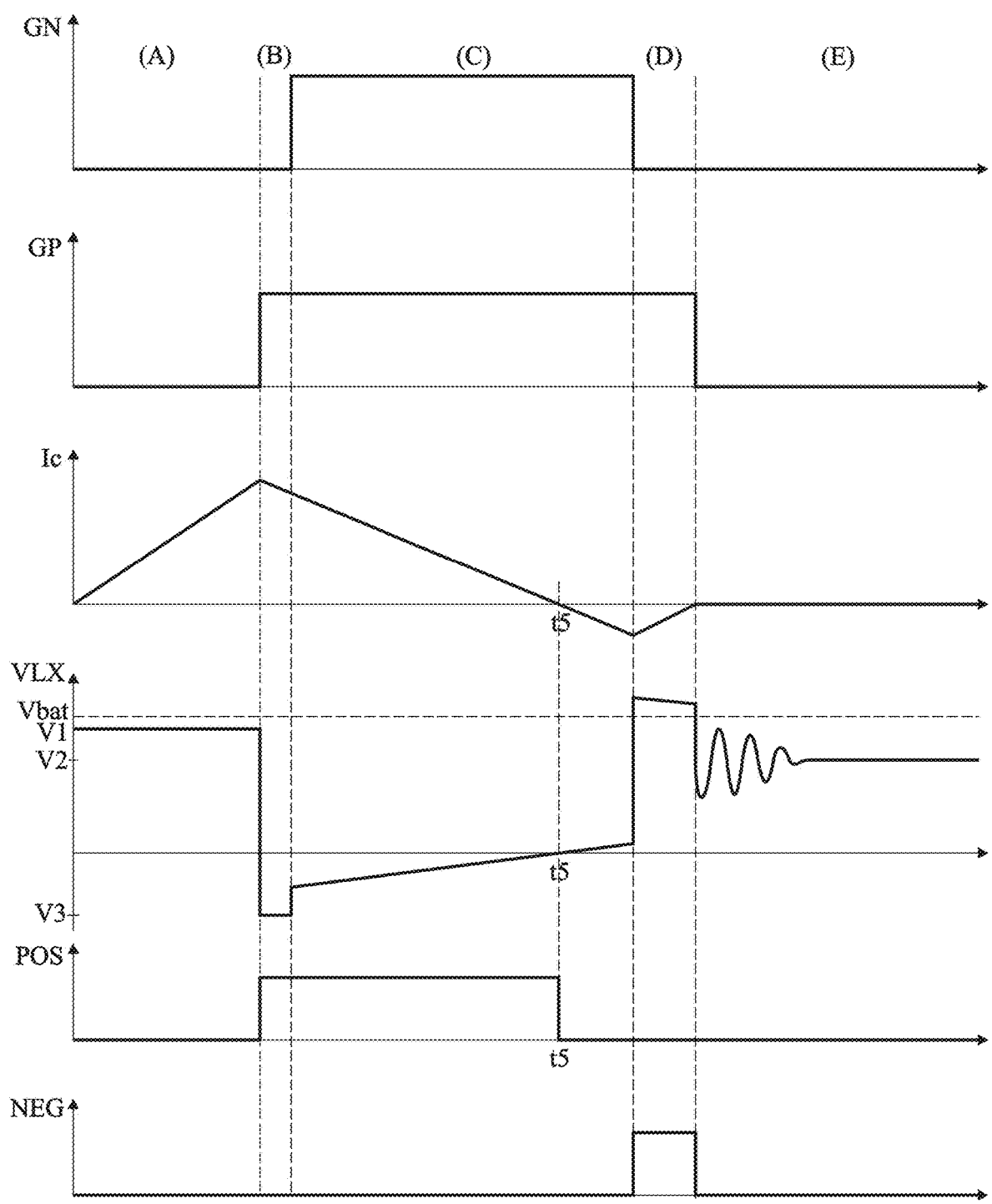
FIG. 3 shows timing diagrams illustrating the operation of the embodiment of FIG. 1.

FIG. 3 shows timing diagrams illustrating the operation of the embodiment of FIG. 1. More particularly, FIG. 3 shows the operation of control signals GN, GP, of current Ic, of voltage VLX on node 206, and signals POS and NEG, during an operating cycle of circuit 20 of FIG. 1. The operating cycle comprises, as in FIG. 2, four phases: a phase (A) of power storage in the inductive element, an intermediate phase (B), a power delivery phase (C), and a compensation phase (D).

Phases (A) and (B) are identical to phases (A) and (B) of FIG. 2. They will not be described again.

During power delivery phase (C), transistor 204 is on and transistor 202 is off. This corresponds, in the embodiment of FIG. 1, to control signal GN having a high value and to control signal GP having a high value.

Voltage VLX increases during phase (C). At a time tz of phase (C), voltage VLX reaches value zero, and then keeps on increasing. Current Ic decreases during phase (C). At time tz, current Ic reaches value zero. During phase (C), current Ic is thus positive before time tz and negative after time tz and voltage VLX is positive before time tz, and negative after time tz.

During phase (C), voltage VLX is smaller than the first voltage threshold Vbat. Thus, signal NEG maintains the low value. Further, voltage VLX is smaller than second voltage threshold GND before time tz, and greater than the second threshold after time tz. Thus, during phase (C), signal POS takes the high value before time tz and the low value after time tz.

During phase (D), transistor 204 is off and transistor 202 is off. This corresponds, in the embodiment of FIG. 1, to control signal GN having a low value and to control signal GP having a high value.

Transistors 202 and 204 being off, and current Ic being negative, diode 218 becomes active. Voltage VLX thus becomes greater than voltage Vbat, for example, substantially equal to voltage Vbat plus the threshold voltage of diode 218. Thus, current Ic increases to reach zero. When the current reaches value zero, phase (D) is over.

Voltage VLX being greater than the control voltage of transistor 110, that is, power supply voltage Vbat, signal NEG has a high value. Further, voltage VLX is greater than the control voltage of transistor 108, that is, reference voltage GND, signal POS has a low value.

Phase (D) is followed by a phase (E), where the device behaves similarly to its behavior in phase (A). As a variant, phase (E) corresponds to a phase in the off state.

Figure 4:
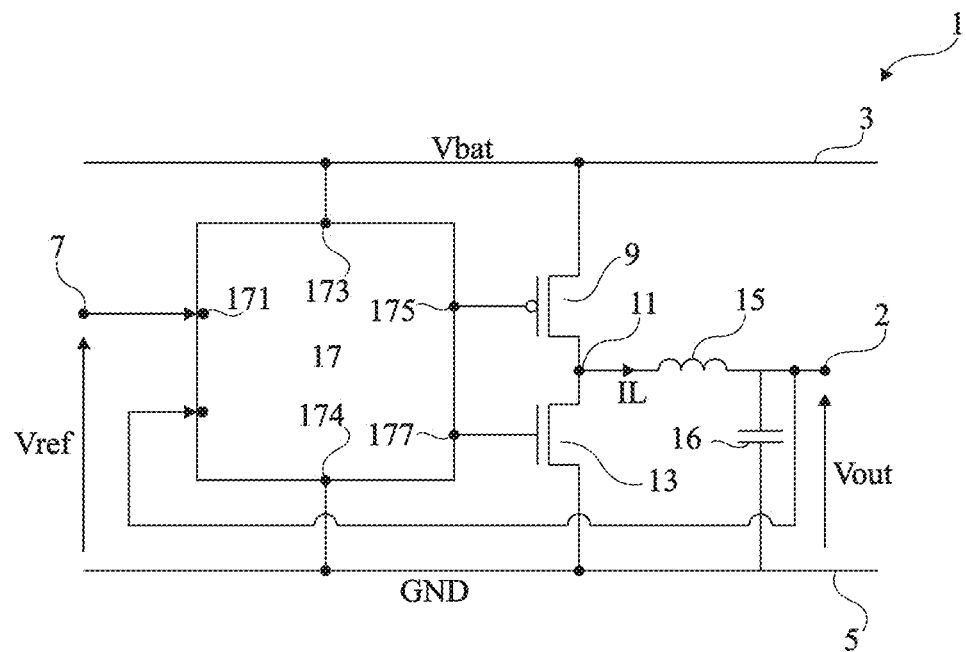
FIG. 4 schematically shows an embodiment of a DC/DC voltage converter.

FIG. 4 schematically shows an embodiment of a DC/DC voltage converter. In this example, converter 1 is a DC/DC converter, which converts a DC power supply voltage into a DC output voltage.

Converter 1 is configured to deliver a DC output voltage Vout. The converter comprises an output node 2 having voltage Vout available thereon.

Converter 1 is powered with a DC power supply voltage Vbat. Converter 1 is then connected between a first conductive rail or node 3 set to voltage Vbat and a second conductive rail, or node, 5 set to reference potential GND.

Converter 1 is configured to deliver voltage Vout at a value equal to a set point value. For this purpose, converter 1 receives, on an input node 7, a DC set point voltage Vref referenced to potential GND, having a value representative of the set point value of voltage Vout, preferably equal to the set point value of voltage Vout.

In this example, voltages Vout, Vbat, and Vref are positive.

In this example, converter 1 is of buck type, that is, the set point value of voltage Vout is smaller than the value of voltage Vbat. In other words, the value of voltage Vout is smaller than that of voltage Vbat.

Converter 1 comprises a first MOS ("metal oxide semiconductor") transistor 9, preferably a PMOS transistor (P-channel MOS transistor). As a variant, transistor 9 may also be an NMOS transistor associated with a bootstrap system. MOS transistor 9 is connected between rail 3 and an inner node 11. In other words, a first conduction terminal of transistor 9, for example, its source, is connected to rail 3, a second conduction terminal of transistor 9, for example, its drain, being connected to node 11.

Converter 1 further comprises a second MOS transistor 13, preferably an NMOS transistor (N-channel MOS transistor). Transistor 13 is connected between node 11 and rail 5. In other words, a first conduction terminal of transistor 13, for example, its source, is connected to rail 5, a second conduction terminal of transistor 13, for example, its drain, being connected to node 11. As a variant, NMOS transistor 13 may be replaced with a diode or a Schottky diode.

Thus, transistors 9 and 13 are series-connected between rails 3 and 5 and are connected to each other at the level of inner node 11.

Converter 1 comprises an inductive element or inductance 15. Inductance 15 is connected between node 11 and node 2.

Converter 1 comprises a control circuit 17. Circuit 17 is configured to implement, or control, the operating cycles of converter 1, to regulate voltage Vout so that its value is equal to set point value Vref.

For this purpose, circuit 17 comprises:
- a terminal 171 coupled, preferably connected, to node 7;
- a terminal 172 coupled, preferably connected, to node 2;
- a terminal 173 coupled, preferably connected, to rail 3;
- a terminal 174 coupled, preferably connected, to rail 5;
- a terminal 175 coupled, preferably connected, to a control terminal, or gate, of transistor 9; and
- a terminal 176 coupled, preferably connected, to a control terminal, or gate, of transistor 13.

Converter 1 comprises an output capacitor 16 connected between node 2 and rail 5. As an example, this capacitance is in the order of from 2.2 µF to 20 µF, or even more. Such an output capacitor plays the role of a filter. In other words, the converter output capacitor enables to smooth the current present on node 2 and to store power supplied to node 2 by the converter.

In operation, a load is connected between node 2 and rail 5 to be powered with voltage Vout. This load for example comprises an input capacitor between node 2 and rail 5.

In this example, converter 1 is configured to operate in pulse frequency modulation (discontinuous conduction mode). Circuit 17 is then configured to start an operating cycle of converter 1 when the value of voltage Vout is smaller than set point value Vref and the two transistors 9 and 13 are in the off state. More particularly, at the beginning of each operating cycle, circuit 17 is configured to control the setting to the on state of transistor 9, transistor 13 being left in the off state. Power is then stored in inductance 15 and in capacitor 16, during a first time period TPon, for example constant for each operating cycle when transistor 9 is maintained in the on state by circuit 17, a current IL then flowing through inductance 15. At the end of time period TPon, circuit 17 is configured to control the setting to the off state of transistor 9 and the setting to the on state of transistor 13. Power is then delivered back by inductance 15 and capacitor 16 to the load connected at the converter output, for a second time period TNon, for example constant for each operating cycle when transistor 13 is maintained in the on state by circuit 17, the current IL in the inductance decreasing. At the end of time period TNon, circuit 17 is configured to control the setting to the off state of transistor 13.

Time period TNon is determined so that the time when circuit 17 controls the setting to the off state of transistor 13 corresponds to the time when the current IL flowing through inductance 15 becomes null. However, in practice, as will be described in further detail in the rest of the disclosure, this is not always true, which raises an issue.

Figure 5:
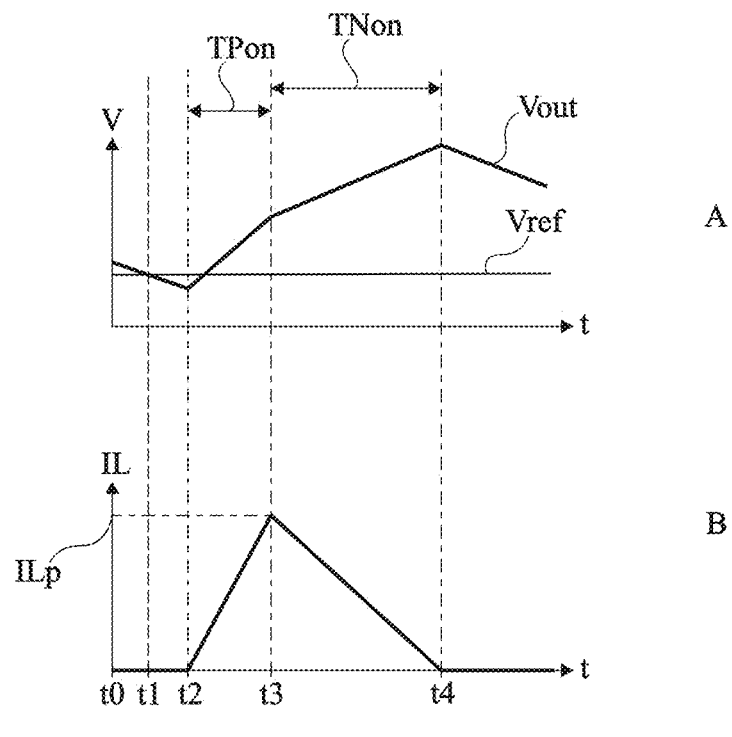
FIG. 5 shows timing diagrams illustrating an example of operation of the converter of FIG. 4.

FIG. 5 shows timing diagrams illustrating an example of desired operation of the converter 1 of FIG. 4.

A timing diagram A (at the top of FIG. 5) illustrates the variation over time t of voltage Vout, in volts V, a timing diagram B (at the bottom of FIG. 5) illustrating the corresponding variation, over time t, of the current IL flowing through inductance 15.

At a time t0, transistors 9 and 13 are in the off state, current IL is null, and the value of voltage Vout is greater than its set point value, in the present example the value of voltage Vref.

Between time t0 and a subsequent time t2, voltage Vout decreases, for example due to the fact that the load connected to converter 1 consumes current and discharges the output capacitor.

At a time t1 between times t0 and t2, voltage Vout becomes smaller than its set point value Vref. This is detected by the circuit 17 of converter 1, which then controls the setting to the on state of transistor 9. Transistor 9 turns on at time t2.

Thus, from time t2, inductance 15 has a terminal connected to node 2 and a terminal coupled to rail 3, via transistor 9. The current IL flowing through inductance 15 increases.

As a result, from time t2, current IL is supplied to node 2, and capacitor 16 between node 2 and rail 5 charges. Voltage Vout increases and becomes greater than its set point value Vref.

At a next time t3, equal to t2+TPon, circuit 17 controls the setting to the on state of transistor 13 and the setting to the off state of transistor 9. At time t3, the current in the inductance has a maximum value ILp.

Thus, from time t3, inductance 15 has a terminal connected to node 2 and a terminal coupled to rail 5, via transistor 13. The current IL flowing through inductance 15 decreases.

Although current IL decreases from time t3, the capacitor between node 2 and rail 5 keeps on charging and voltage Vout keeps on increasing if the current drawn by the load is smaller than the current IL supplied to node 2.

At a next time t4, equal to t3+TNon, circuit 17 controls the setting to the off state of transistor 13. It is here considered that converter 1 operates as it should, and current IL is then null at time t4. However, in practice, this is not always true.

From time t4, current IL is null and voltage Vout decreases, similarly to what would happen at time t0.

Although this is not shown herein, when the value of potential Vout falls back below its set point value Vref at a time subsequent to time t4, circuit 17 implements a new operating cycle such as described in relation with successive times t2, t3, and t4.

Figure 6:
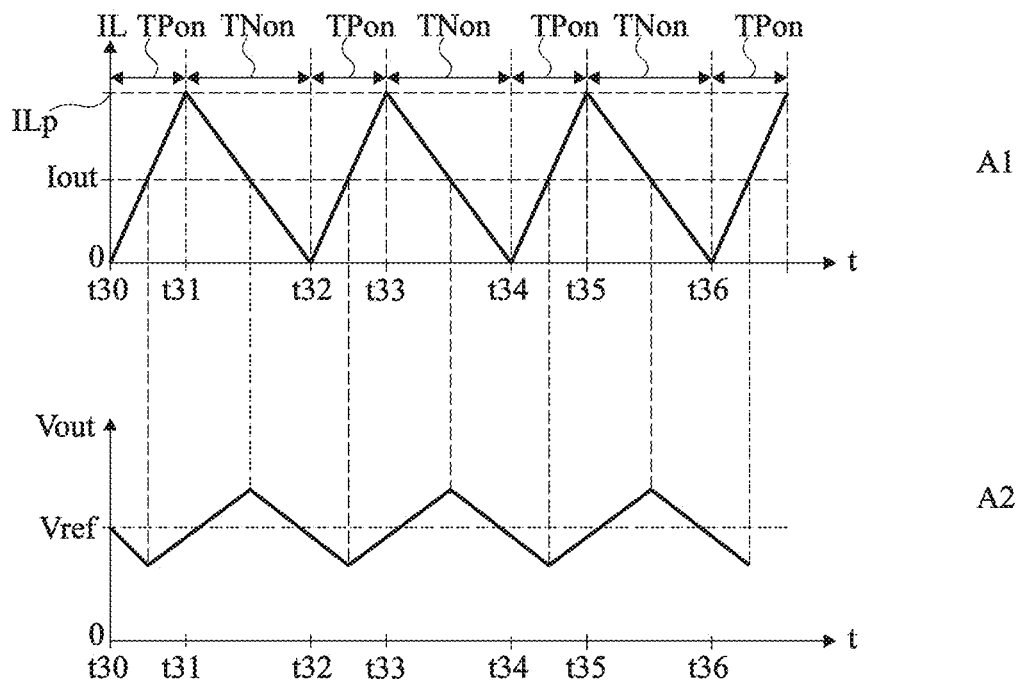
FIG. 6 shows other timing diagrams illustrating the desired or theoretical operation and the real or practical operation of the converter of FIG. 4.
Figure 6:
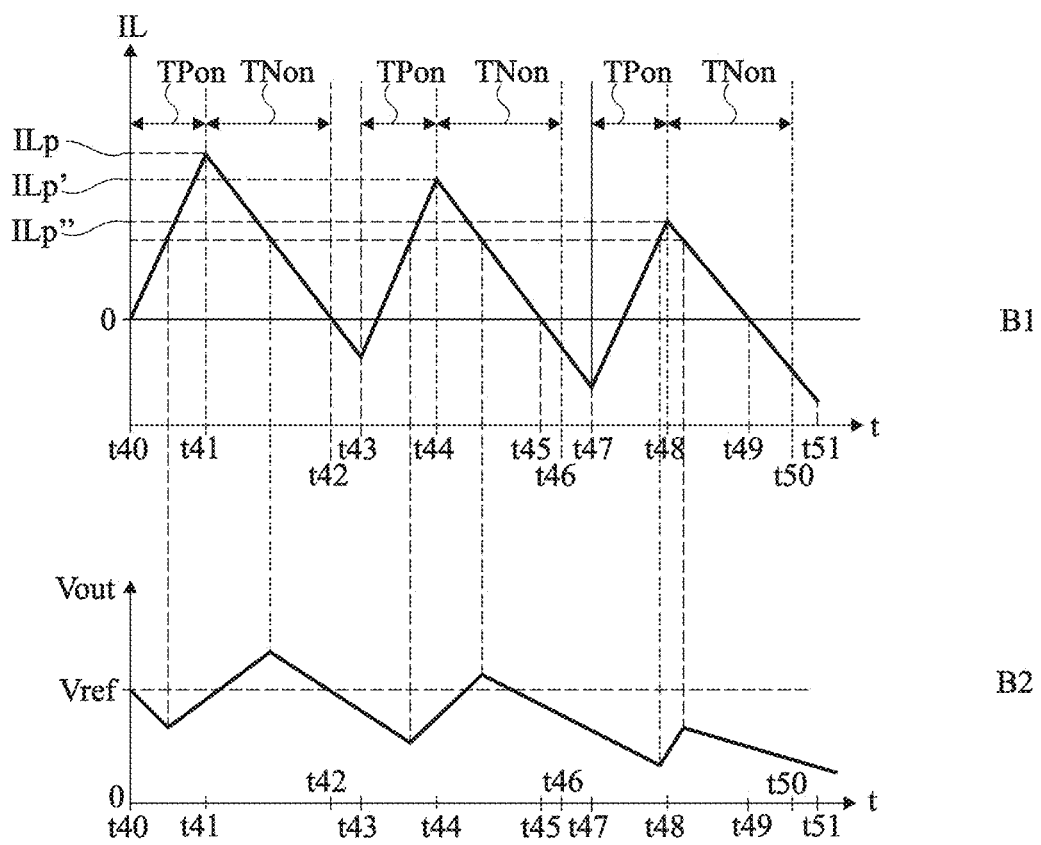

FIG. 6 shows other timing diagrams illustrating the operation of the converter 1 of FIG. 4. More particularly, a timing diagram A1 shows an ideal or theoretical example of the variation of current IL, a timing diagram A2 shows the voltage Vout corresponding to the variations of current IL of timing diagram A1, a timing diagram B1 shows an example of the real variation of current IL, and a timing diagram B2 shows the voltage Vout corresponding to the variations of current IL of timing diagram B1. These timing diagrams illustrate an example of operation where, for a plurality of successive operating cycles, voltage Vout is smaller than voltage Vref at the end of each operating cycle of converter 1. It is considered that the current taken on the output node is a constant current Iout.

At a time t30 (timing diagrams A1 and A2), voltage Vout is smaller than voltage Vref. An operating cycle starts with the switching to the on state of transistor 9. As a result, current IL increases until a next time t31 equal to t30+TPon.

At time t31, current IL reaches its maximum value ILp. Further, transistor 9 and 13 are respectively switched to the off state and to the on state. As a result, the current decreases until a next time t32 equal to t31+TNon.

In this example of ideal operation, transistor 13 is switched to the off state at time t32, and current IL becomes zero at time t32.

At a time t32, voltage Vout being smaller than voltage Vref, transistor 9 is switched to the on state, which marks the beginning of a new operating cycle. Current IL then increases until a next time t33 equal to t32+TPon.

At time t33, current IL reaches value ILp. Further, transistor 9 and 13 are respectively switched to the off state and to the on state. As a result, the current decreases until a next time t34 equal to t33+TNon.

In this example of ideal operation, transistor 13 is switched to the off state at time t34, and current IL becomes zero at time t34.

At a time t34, voltage Vout being smaller to voltage Vref, transistor 13 is switched to the on state, which marks the beginning of a new operating cycle. Current IL increases until a next time t35 equal to t34+TPon.

At time t35, current IL reaches value ILp. Further, transistor 9 and 13 are respectively switched to the off state and to the on state. As a result, the current decreases until a next time t36 equal to t35+TNon.

In this example of ideal operation, transistor 13 is switched to the off state at time t36 and current IL becomes zero at time t36.

At time t36, voltage Vout being smaller than voltage Vref, a new operating cycle starts.

In the example of theoretical operation illustrated by timing diagrams A1 and A2, at the end of each operating cycle, the switching of transistor 13 in the off state occurs at the time when current IL becomes null. Thus, when an operating cycle is immediately followed by a new operating cycle, in this new operating cycle, current IL increases from a null value.

Timing diagrams B1 and B2 illustrates a corresponding example of real operation of converter 1. In this example of real operation, the practical case where transistor 13 is not immediately switched to the off state at the end of the time period TNon which has elapsed from its last switching to the on state is considered.

At a time t40 (FIGS. 6B1 and 6B2), voltage Vout being smaller than voltage Vref, an operating cycle starts with the switching to the on state of transistor 9. As a result, current IL increases until a next time t41 equal to t40+TPon.

At time t41, current IL reaches its maximum value ILp. Further, transistor 9 and 13 are respectively switched to the off state and to the on state. As a result, the current decreases until a next time t42 equal to t41+TNon. The current becomes null at time t42. However, the switching of transistor 13 to the off state is only effective at a time t43 subsequent to time t42. Thus, between times t42 and t43, current IL is negative and decreases. In other words, the current flows in inductance 15 from node 11 to node 2 before time t42, becomes null at time t42, and flows through inductance 15, from node 2 to node 11 after time t42.

At a time t43, voltage Vout being smaller than voltage Vref, transistor 9 is switched to the on state at time t43, which marks the beginning of a new operating cycle. Current IL then increases until a next time t44 equal to t43+TPon.

At time t44, current IL reaches a value ILp' smaller than maximum value ILp due to the fact that time period TPon is constant at each cycle. Further, transistor 9 and 13 are respectively switched to the off state and to the on state. As a result, current IL decreases until a next time t46 equal to t44+TNon, current IL becoming null at a time t45 between times t44 and t46. Further, the switching of transistor 13 to the off state is only effective at a time t47 subsequent to time t46. Thus, between times t45 and t47, current IL is negative and decreases to a value lower (or higher in absolute value) than that reached at time t43.

At time t47, voltage Vout being smaller than voltage Vref, transistor 9 is switched to the on state at time t47, which marks the beginning of a new operating cycle. Current IL then increases until a next time t48 equal to t47+TPon.

At time t48, current IL reaches a value ILp", smaller than value ILp'. Further, transistor 9 and 13 are respectively switched to the off state and to the on state. As a result, current IL decreases until a next time t50 equal to t48+TNon, current IL becoming null at a time t49 between times t48 and t50. Further, the switching of transistor 13 to the off state is only effective at a time t51 subsequent to time t50. Thus, between times t49 and t51, current IL is negative and decreases to a value lower (or higher in absolute value) than that reached at time t47.

Due to the fact that at each operating cycle illustrated by timing diagrams B1 and B2, the maximum value reached by current IL (times t41, t44, and t48) is lower and lower, converter 1 does not supply enough power to node 2 to regulate voltage Vout on its value Vref, voltage Vout being for example lower and lower, which raises an issue. Further, at each operating cycle illustrated by timing diagrams B1 and B2, the negative value reached by current IL (times t43, t47, and t51) is lower and lower (or higher and higher in absolute value), whereby converter 1 samples more and more power from node 2, which is not desirable. Indeed, the value of the current supplied to the load, and in particular the value of the current peak, decreases from one cycle to the other, which has a negative impact on the load power supply. Further, although, theoretically, the maximum value of current IL might infinitely decrease, in practice, transistor 13 may in certain cases be destroyed or damaged before this by negative values of the current IL that transistor 13 is not capable of conducting between its conduction terminals.

A practical example of operation where the switching to the off state of transistor 13 occurs after current IL becomes null has been described in relation with timing diagrams B1 and B2 of FIG. 6.

In another practical example of operation, not illustrated, at each operating cycle of a plurality of successive cycles implemented immediately one after the others, transistor 13 is switched to the off state while current IL is not null and is still positive. In this case, at each of the operating cycles, current IL increases from a higher and higher value, whereby current IL reaches a higher and higher maximum value, and the operating cycle ends with a higher and higher positive non-zero value of current IL. This operation is less disturbing than that described in relation with timing diagrams B1 and B2 since, after a plurality of operating cycles, voltage Vout will have recovered its set point value Vref. Thus, the next operating cycle will not be immediately implemented, which will leave time for current IL to become null.

Both cases, that is, the case described in relation with timing diagrams B1 and B2 of FIG. 3 and the other above-described practical case, are generally at least partly caused by imperfections at the level of the components, in particular of the comparators, particularly by operating times (response or propagation time), of comparators and by offsets at the level of the comparators. In other words, instead of comparing input signals S1 and S2, a comparator compares signals S1 and S2+A, A being the offset of the comparator.

Figure 7:
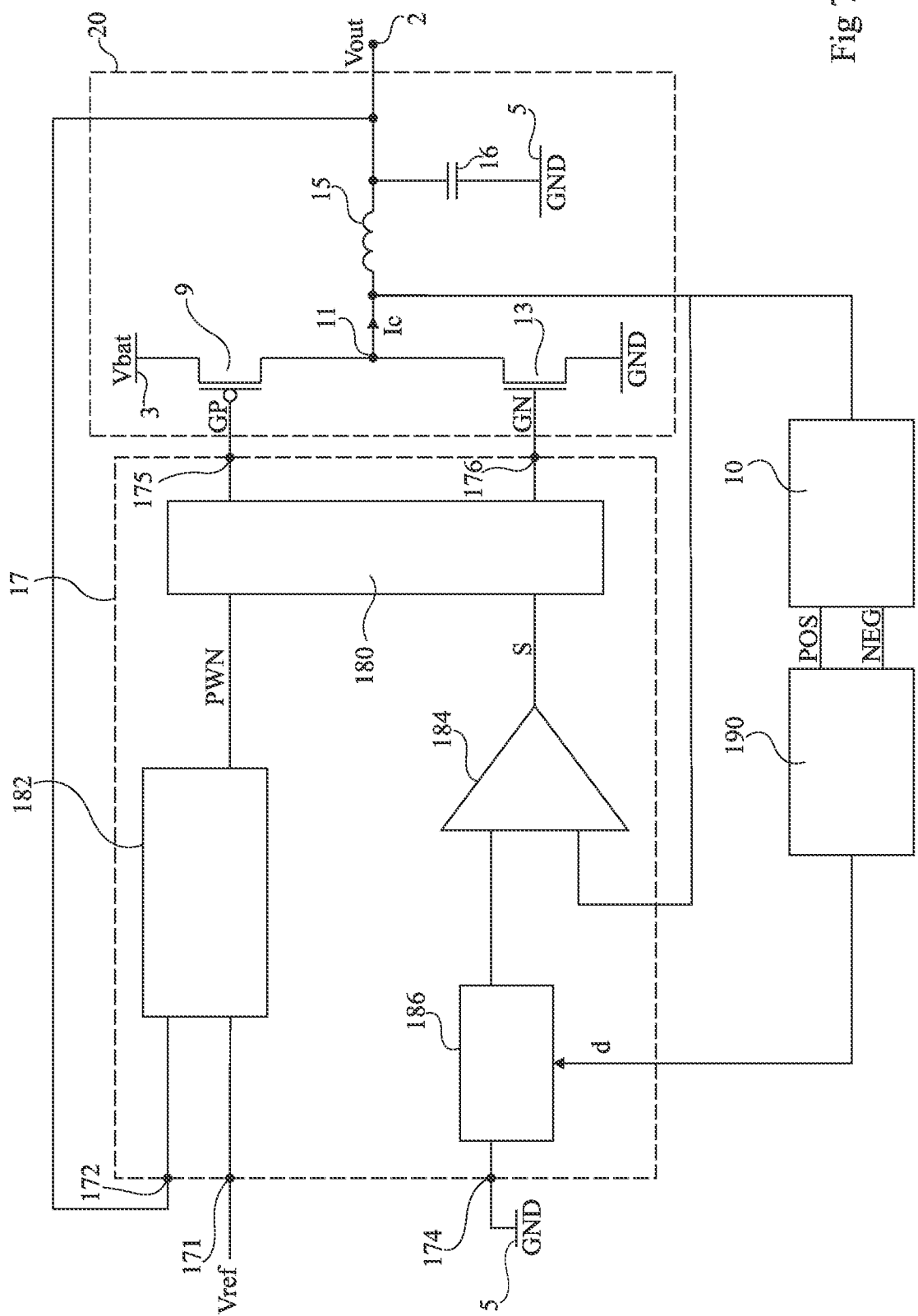
FIG. 7 shows an embodiment of a DC/DC voltage converter comprising the embodiment of FIG. 1.

FIG. 7 shows an example of application of the embodiment of the circuit 10 of FIG. 1, in a DC/DC voltage converter. The converter of FIG. 7 comprises the elements described in relation with FIG. 4, circuit 17 being more detailed.

The converter comprises transistors 9 and 13, inductance 15, and capacitor 16, described in relation with FIG. 4.

Transistors 9 and 13 are, like the transistors 202 and 204 of FIG. 1, coupled, preferably connected, in series between rail 3 of application of a power supply voltage Vbat and rail 5 of application of a reference voltage, for example, ground GND. In other words, one of the conduction terminals, source or drain, of transistor 9 is coupled, preferably connected, to rail 3 and the other conduction terminal, drain or source, is coupled, preferably connected, to central node 11. One of the conduction terminals of transistor 13, source or drain, is coupled, preferably connected, to node 11 and the other conduction terminal, drain or source, is coupled, preferably connected, to rail 5.

Preferably, transistor 9 is a P-type field-effect or PMOS transistor and transistor 13 is an N-type field-effect or NMOS transistor.

Each of transistors 9 and 13 comprises an intrinsic diode, not shown.

The intrinsic diodes, not shown, are, like diodes 218 and 220 of FIG. 1, series-coupled between rail 3 and rail 5. More particularly, a first terminal, anode or cathode, of the intrinsic diode of transistor 13 is coupled, preferably connected, to rail 5 and a second terminal, cathode or anode, of the diode is coupled, preferably connected, to node 11. A first terminal, anode or cathode, of the intrinsic diode of transistor 9 is coupled, preferably connected, to node 11 and a second terminal, cathode or anode, of the diode is coupled, preferably connected, to rail 3. In the example of FIG. 1, the first terminals of the intrinsic diodes are the anodes and the second terminals of the intrinsic diodes are the cathodes. Node 11 is thus coupled to the anode of one of the diodes and to the cathode of the other diode.

The converter comprises a circuit 180 for generating control signals GP, GN, a circuit 182 for delivering a signal PWN determining durations TPon and TNon, a circuit 184 configured to determine the times of beginning of each operating cycle and a circuit 186 generating a variable voltage.

Circuit 180 comprises first and second outputs 180*a* and 180*b*, respectively coupled, preferably connected, to outputs 175 and 176 of circuit 17. Circuit 180 generates, on first output 180*a*, signal GP for controlling transistor 9 and, on second output 180*b*, signal GN for controlling transistor 13.

Circuit 180 comprises an input 180*c* coupled, preferably connected, to an output of circuit 182. Circuit 182 supplies, on this output, the signal PWN determining durations TPon and TNon, and thus determining the durations of the power storage and power delivery phases.

Circuit 182 comprises two inputs 182*a* and 182*b*, respectively coupled, preferably connected, to inputs 171 and 172 of circuit 17. Circuit 182 thus generates signal PWN according to the value of voltage Vout, received on input 172, and set point voltage Vref, received on input 171, and more particularly according to the difference between these values. Thus, if voltage Vout is smaller than voltage Vref, duration TPon is increased and duration TNon is decreased. If voltage Vout is greater than voltage Vref, duration TNon is increased and duration TPon is decreased.

The converter comprises circuit 184 configured to determine the times of beginning of each operating cycle. More particularly, circuit 184 is configured to determine the time at which current Ic reaches value zero, that is, the end of an operating cycle. In practice, this corresponds to the detection of a zero crossing of voltage VLX. Circuit 184 comprises an output coupled, preferably connected, to circuit 180 to deliver this information by means of a signal S taking a high value when current Ic reaches value zero.

Circuit 184 is for example a zero crossing detect circuit (ZCD). Circuit 184 comprises a comparator.

The comparator of circuit 184 is subject to the defects discussed in relation with FIG. 6B. More particularly, the propagation delay and the offset of the input voltages of the comparator cause comparison defects, as described in relation with FIG. 6B.

Circuit 184 is coupled at its input to rail 5, delivering reference voltage GND, and to node 11, delivering voltage VLX.

Circuit 184 is coupled to rail 5 by circuit 186 configured to modify the value with which voltage VLX is compared, to compensate for the propagation delay and the offset of the comparator of circuit 184. For example, circuit 186 is a variable voltage source. Thus, the output voltage of circuit 186, that is, the input voltage of circuit 184 which is compared with voltage VLX, may be different from zero. Circuit 184 does not compare voltage VLX with value zero but with the output value of circuit 186. The output value of circuit 186 is for example modified at each operating cycle.

To determine whether circuit 186 should modify its output value, circuit 186 receives a signal d. Signal d is generated by an assembly of circuits comprising a circuit 10 and a circuit 190. Circuit 10 is thus coupled, preferably connected, at its input to node 11. Circuit 10 comprises two outputs having signals POS and NEG generated thereon.

Circuit 190 is coupled, preferably connected, at its input, to the outputs of circuit 10 and thus receives as an input signals POS and NEG. Circuit 190 determines the sign of current IC during phase (D) and generates signal d controlling the modification of the output value of circuit 186. The voltage modification of circuit 186 is thus dependent on the sign of current Ic during phase (D) and preferably independent from the sign of the current during the other phases.

Figure 8:
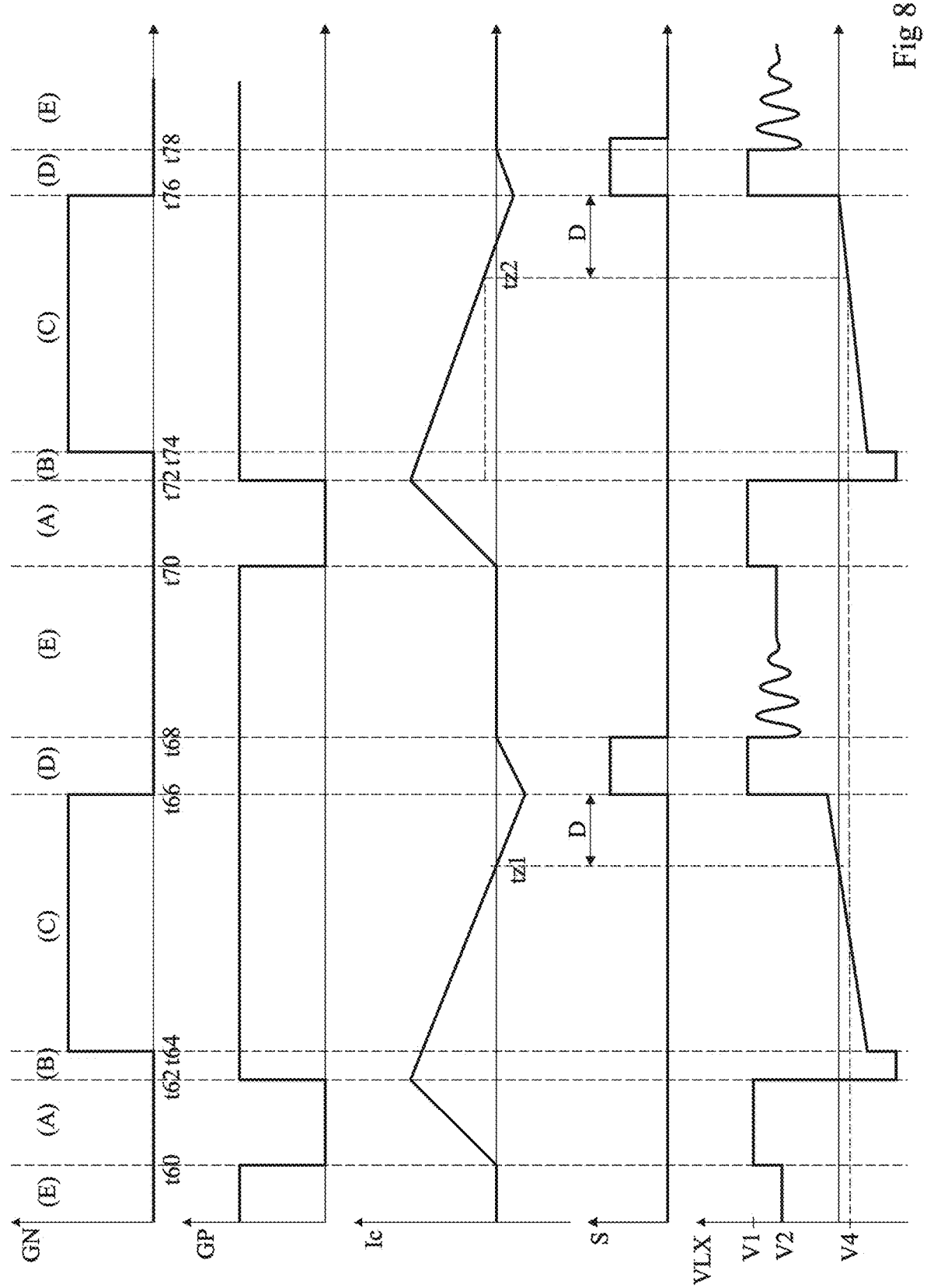
FIG. 8 shows timing diagrams illustrating an example of operation of the embodiment of FIG. 7.

FIG. 8 shows timing diagrams illustrating an example of operation of the embodiment of FIG. 7. FIG. 8 shows two operating cycles of the converter, separated from each other by a stop phase.

During a first stop phase (E), transistors 9 and 13 are off. This corresponds to signals GN and GP respectively having a low value and a high value. During this phase, current Ic is zero and voltage VLX has a value substantially equal to a value V2, positive and smaller than voltage Vbat. Further, signal S, preferably binary, for example has a low value.

At a time t60, a phase (A) of an operating cycle starts. Time t60 thus corresponds to the end of a phase (E) and to the beginning of a phase (A).

At time t60, transistor 9 turns on. In other words, the value of control signal GP takes the other binary value, here the low value. Node 11 is thus powered with rail 3. Thus, the voltage on the node takes value V1, slightly smaller than value Vbat but greater than value V2, and current Ic increases.

At a time t62, phase (A) ends and phase (B) starts. The duration of phase (A) corresponds to duration TPon.

As in the case of phases (B) of FIGS. 2 and 3, transistor 9 is off and transistor 13 is off. This corresponds, in the embodiment of FIG. 7, to control signal GN having a low value and to control signal GP having a high value. Phase (B) is an intermediate phase enabling to ensure that transistors 9 and 13 are not simultaneously on. During phase (B), node 11 is no longer powered by rail 3. Current Ic thus decreases.

Current Ic is positive and transistors 202 and 204 are off. Current Ic thus crosses diode 220. Voltage VLX takes a negative value V3.

During phase (B), as described in relation with FIGS. 2 and 3, signal POS takes a high value. However, circuit 190 does not take into account signals POS and NEG during phase (B).

At a time t62, phase (B) ends and phase (C) starts. Transistor 13 is on and transistor 9 is off. This corresponds, in the embodiment of FIG. 7, to control signal GN having a high value and to control signal GP having a high value. Voltage VLX increases and current Ic crossing inductance 15 decreases, node 11 being no longer powered by rail 3.

At a time tz1 of phase (C), that is, after duration TNon, current Ic and voltage VLX reach value zero. However, circuit 184 has a propagation delay of value D. Thus, the output S of circuit 184 only takes a high value, indicating the zero crossing of current Ic, at a time t66 separated from tz1 by time period D. Between time tz1 and time t66, current Ic becomes negative.

At time t66, circuit 180 is informed, by the rising edge of signal S, that current Ic has reached value zero. Phase (C) is thus finished and phase (D) starts.

During phase (D), transistors 9 and 13 are off. This corresponds, in the embodiment of FIG. 7, to control signal GN having a low value and to control signal GP having a high value.

Transistors 9 and 13 being off, and current Ic being negative, the intrinsic diode of transistor 9 becomes active. Voltage VLX thus becomes greater than voltage Vbat, for example, substantially equal to voltage Vbat plus the threshold voltage of the diode. Thus, current Ic increases to reach zero at a time t68. When the current reaches value zero, the diode is no longer on and phase (D) is over.

At time t68, a phase (E), such as previously described, starts. Voltage VLX recovers value V2.

Phase (E) is followed by a second operating cycle comprising a phase (A) between times t70 and t72, a phase (B) between time t72 and a time t74, a phase (C) between time t74 and a time t76, and a phase (D) between time t76 and a time t78.

The second operating cycle differs from the first cycle in that, before phase (C), for example during phase (A), circuit 190 supplies a signal d to circuit 186 to modify the value of the output signal of circuit 186. In the case of the second operating cycle, the value of the output of circuit 186 is modified to be equal to a value V4 smaller than the value of the reference voltage, here, the ground.

Thus, circuit 184 compares voltage VLX with value V4. Value V4 is here reached, at a time tz2, sooner than value zero is reached. Phase (C) ends time period D after time tz2. The negative value reached by current Ic at the end of phase (C) is closer to zero than the value reached by current Ic at the end of the previous phase (C).

An advantage of the described embodiments is that it is possible to compare a voltage with two thresholds by a simple circuit.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic device comprising:
   a first circuit comprising first and second transistors series-coupled between a node of application of a power supply voltage and a node of application of a reference voltage, the first and second transistors being coupled to each other by a first node;
   a second circuit comprising third and fourth transistors series-coupled between second and third nodes, the second node being coupled to the node of application of the power supply voltage by a first resistive element, the third node being coupled to the node of application of the reference voltage by a second resistive element, and the third and fourth transistors being coupled to each other by a fourth node coupled to the first node, the second circuit configured to compare a first voltage on the first node with first and second voltage thresholds, wherein a control terminal of the third transistor is coupled to a node of application of the second voltage threshold, and a control terminal of the fourth transistor is coupled to a node of application of the first voltage threshold; and
   a third circuit configured to compare the first voltage with a variable second voltage that is dependent on signals on the second and third nodes.

2. The device according to claim 1, wherein the first voltage threshold is the power supply voltage and the second voltage threshold is the reference voltage.

3. The device according to claim 1, wherein the second circuit comprises:
   a first output node having a first signal, taking a first value when the first voltage is greater than the first voltage threshold and a second value when the first voltage is smaller than the first voltage threshold, supplied thereon; and
   a second output node having a second signal, taking a third value when the first voltage is smaller than the second voltage threshold and a fourth value when the first voltage is greater than the second voltage threshold, supplied thereon.

4. The device according to claim 3, wherein the first output node is coupled to the third node and the second output node is coupled to the second node.

5. The device according to claim 3, wherein the first output node is coupled to the third node by two inverting circuits and the second output node is coupled to the second node by an inverting circuit.

6. The device according to claim 3, wherein the device is a switched-mode power supply.

7. The device according to claim 6, wherein the device comprises a fourth circuit configured to control the first and second transistors in such a way that each operating cycle successively comprises:
   a first phase during which the first transistor is on and the second transistor is off;
   a second phase during which the first and second transistors are off;
   a third phase during which the first transistor is off and the second transistor is on; and
   a fourth phase during which the first and second transistors are off.

8. The device according to claim 7, wherein:
   a variation of the variable second voltage is dependent on the first and second signals on the first and second output nodes, respectively, during the fourth phase.

9. The device according to claim 1, wherein the first transistor is connected in parallel with a first diode, the second transistor is connected in parallel with a second diode, an anode of the first diode and a cathode of the second diode being connected to the first node.

10. A method of controlling an electronic device, the electronic device comprising a first circuit including first and second transistors series-coupled between a node of application of a power supply voltage and a node of application of a reference voltage, the first and second transistors being coupled to each other by a first node, and comprising a second circuit including third and fourth transistors that are coupled to the first node and series-coupled between second and third nodes, the second node being coupled to the node of application of the power supply voltage by a first resistive element, and the third node being coupled to the node of application of the reference voltage by a second resistive element the method comprising:

turning each of the first and second transistors on and off according a predetermined pattern in each of a plurality of operating cycles;

comparing, by the third and fourth transistors in the second circuit, a first voltage on the first node with first and second voltage thresholds;

applying the second voltage threshold to a control terminal of the third transistor;

applying the first voltage threshold to a control terminal of the fourth transistor; and comparing, by a third circuit, the first voltage with a variable second voltage that is dependent on signals on the second and third nodes.

11. The method according to claim 10, wherein the first voltage threshold is the power supply voltage and the second voltage threshold is the reference voltage.

12. The method according to claim 10, further comprising:

a first signal of a first output node of the second circuit taking a first value when the first voltage is greater than the first voltage threshold and a second value when the first voltage is smaller than the first voltage threshold; and a second signal of a second output node of the second circuit taking a third value when the first voltage is smaller than the second voltage threshold and a fourth value when the first voltage is greater than the second voltage threshold.

13. The method according to claim 12, further comprising controlling, by a fourth circuit, the first and second transistors in such a way that each operating cycle successively comprises:

a first phase during which the first transistor is on and the second transistor is off;

a second phase during which the first and second transistors are off;

a third phase during which the first transistor is off and the second transistor is on; and a fourth phase during which the first and second transistors are off.

14. The method according to claim 13, wherein a variation of the variable second voltage is dependent on the first and second signals on the first and second output nodes, respectively, during the fourth phase.

15. The method according to claim 12, wherein the first output node is coupled to the third node and the second output node is coupled to the second node.

16. The method according to claim 12, further comprising:

double-inverting the third node to generate the first output node; and single-inverting the second node to generate the second output node.

17. The method according to claim 12, further comprising operating the device as a switched-mode power supply.

18. The method according to claim 10, wherein the first transistor is connected in parallel with a first diode, the second transistor is connected in parallel with a second diode, and an anode of the first diode and a cathode of the second diode are connected to the first node.

19. An electronic device comprising:

a first circuit comprising first and second transistors series-coupled between a node of application of a power supply voltage and a node of application of a reference voltage, the first and second transistors being coupled to each other by a first node;

a second circuit comprising:

third and fourth transistors series-coupled between second and third nodes, the second node being coupled to the node of application of the power supply voltage by a first resistive element, the third node being coupled to the node of application of the reference voltage by a second resistive element, and the third and fourth transistors being coupled to each other by a fourth node coupled to the first node, the second circuit configured to compare a first voltage on the first node with first and second voltage thresholds;

a first output node having a first signal, taking a first value when the first voltage is greater than the first voltage threshold and a second value when the first voltage is smaller than the first voltage threshold, supplied thereon; and a second output node having a second signal, taking a third value when the first voltage is smaller than the second voltage threshold and a fourth value when the first voltage is greater than the second voltage threshold, supplied thereon; and a third circuit configured to compare the first voltage with a variable second voltage that is dependent on signals on the second and third nodes;

wherein the first output node is coupled to the third node by two inverting circuits, and the second output node is coupled to the second node by an inverting circuit.

20. A method of controlling an electronic device, the electronic device comprising a first circuit including first and second transistors series-coupled between a node of application of a power supply voltage and a node of application of a reference voltage, the first and second transistors being coupled to each other by a first node, and comprising a second circuit including third and fourth transistors that are coupled to the first node and series-coupled between second and third nodes, the second node being coupled to the node of application of the power supply voltage by a first resistive element, and the third node being coupled to the node of application of the reference voltage by a second resistive element the method comprising:

turning each of the first and second transistors on and off according a predetermined pattern in each of a plurality of operating cycles;

comparing, by the third and fourth transistors in the second circuit, a first voltage on the first node with first and second voltage thresholds, a first signal of a first output node of the second circuit taking a first value when the first voltage is greater than the first voltage threshold and a second value when the first voltage is smaller than the first voltage threshold, and a second signal of a second output node of the second circuit taking a third value when the first voltage is smaller than the second voltage threshold and a fourth value when the first voltage is greater than the second voltage threshold;

comparing, by a third circuit, the first voltage with a variable second voltage that is dependent on signals on the second and third nodes;

double-inverting the third node to generate the first output node; and single-inverting the second node to generate the second output node.

* * * * *